United States Patent
Yao et al.

(10) Patent No.: US 8,785,958 B2
(45) Date of Patent: Jul. 22, 2014

(54) LIGHT EMITTING ELEMENT

(71) Applicant: Epistar Corporation, Hsinchu (TW)

(72) Inventors: Ciu-Lin Yao, Hsinchu (TW); Min-Hsun Hsieh, Hsinchu (TW); Wen-Huang Liu, Hsincu County (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/850,215

(22) Filed: Mar. 25, 2013

(65) Prior Publication Data

US 2013/0207135 A1 Aug. 15, 2013

Related U.S. Application Data

(63) Continuation of application No. 12/979,281, filed on Dec. 27, 2010, now Pat. No. 8,405,107, which is a continuation-in-part of application No. 12/482,419, filed on Jun. 10, 2009, now Pat. No. 7,880,182, which is a continuation-in-part of application No. 10/906,894, filed on Mar. 11, 2005, now Pat. No. 7,560,738, which is a continuation-in-part of application No. 10/604,245, filed on Jul. 4, 2003, now Pat. No. 6,987,287.

(30) Foreign Application Priority Data

Jul. 15, 2002 (TW) ................................ 91114688 A
Apr. 13, 2004 (TW) ................................ 93110342 A
Mar. 5, 2010 (TW) ................................ 99106549 A

(51) Int. Cl.
    *H01L 33/00* (2010.01)
(52) U.S. Cl.
    USPC .................. 257/98; 257/88; 257/91; 257/93; 257/96; 257/99
(58) Field of Classification Search
    None
    See application file for complete search history.

(56) References Cited

U.S. PATENT DOCUMENTS 6,319,778 B1 * 11/2001 Chen et al. ..................... 438/273
2004/0119403 A1 * 6/2004 McCormick et al. ......... 313/506

* cited by examiner

*Primary Examiner* — Kyoung Lee

(57) ABSTRACT

A light emitting element is provided in this application, including a carrier; a conductive connecting structure disposed on the carrier and including a transparent conductive connecting layer; and an epitaxial stack structure disposed on the conductive connecting structure and including a plurality of electrically connected epitaxial light-emitting stacks, which substantially have the same width.

12 Claims, 7 Drawing Sheets

LIGHT EMITTING ELEMENT

REFERENCE TO RELATED APPLICATION

This application is a Continuation of U.S. patent application Ser. No. 12/979,281, filed on Dec. 27, 2010 and entitled "LIGHT EMITTING ELEMENT", which is a Continuation-In-Part of U.S. patent application Ser. No. 12/482,419, filed on Jun. 10, 2009 (now U.S. Pat. No. 7,880,182), which is a Continuation-In-Part of U.S. patent application Ser. No. 10/906,894, filed on Mar. 11, 2005 (now U.S. Pat. No. 7,560,738), which is a Continuation-In-Part of U.S. patent application Ser. No. 10/604,245, filed on Jul. 4, 2003 (now U.S. Pat. No. 6,987,287), the entire contents of which are incorporated by reference herein.

TECHNICAL FIELD

The application relates to a light emitting element, and more particularly to a light emitting element including light emitting array.

DESCRIPTION OF BACKGROUND ART

The lighting theory and structure of light-emitting diode (LED) is different from that of conventional lighting source. LED has advantages as a low power loss, a long life-time, no need for warming time, and fast responsive time. Moreover, it is small, shockproof, suitable for mass production, and highly compatible with application demand for a tiny or array-type element, so LEDs are widely adopted in the market. For example, LEDs can be used in optical display apparatus, laser diodes, traffic lights, data storage devices, communication devices, illumination devices, medical devices, and so on.

As shown in FIG. 1, a conventional light-emitting array includes: an insulative sapphire substrate 10; a plurality of light-emitting stacks 12 formed on the insulative sapphire substrate 10 and including a p-type semiconductor layer 121, an active layer 122, and an n-type semiconductor layer 123. Because the sapphire substrate 10 is insulative, the light-emitting stacks can be insulated from each other by forming trenches therebetween with etching processes. Furthermore, after partially etching the plurality of light-emitting stacks 12 to the n-type semiconductor layer 123, a first electrode 18 is formed on the exposed area of the n-type semiconductor layer 123, and a second electrode 16 is formed on the p-type semiconductor layer 121. Metal wires 19 are then provided to selectively connect the first electrode 18 and the second electrode 16 to connect the plurality of light-emitting stacks 12 in parallel or series configuration.

SUMMARY OF THE DISCLOSURE

The present application discloses a light emitting element comprising: a carrier; a conductive connecting structure disposed on the carrier; an epitaxial stack structure disposed on the conductive connecting structure and comprising: at least a first light-emitting stack comprising a first semiconductor layer and a second semiconductor layer, and two electrodes are respectively formed on the surface of the first semiconductor layer and the second semiconductor layer; and at least a second light-emitting stack comprising a third semiconductor layer electrically connected to the conductive connecting structure by the bottom surface thereof and a forth semiconductor layer having a electrode on the surface thereof; and at least an insulation section disposed between the first light-emitting stack and the conductive connecting structure to insulate the first light-emitting stack from the conductive connecting structure.

DETAILED DESCRIPTION OF PREFERRED EMBODIMENTS

First Embodiment

Figure 1:
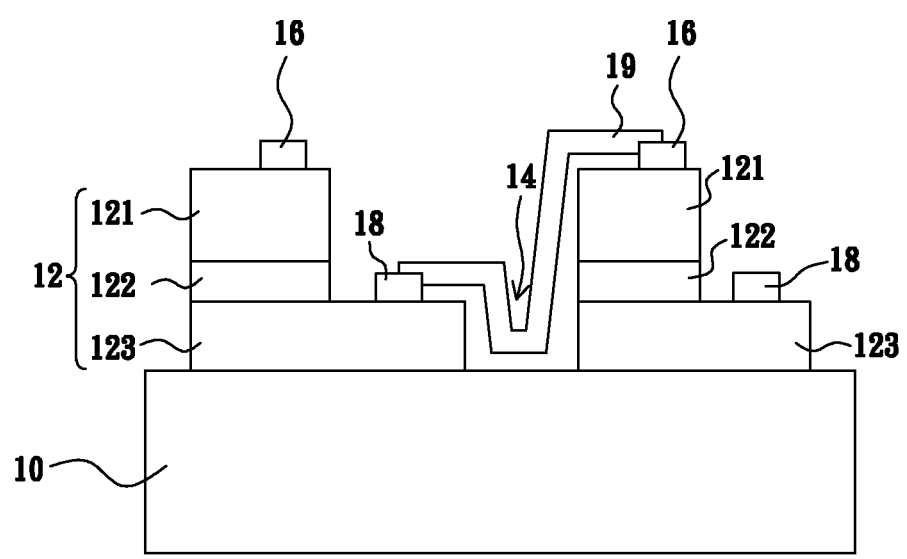
FIG. 1 shows a schematic structure diagram of a conventional light emitting element having light-emitting stack arrays.
Figure 2:
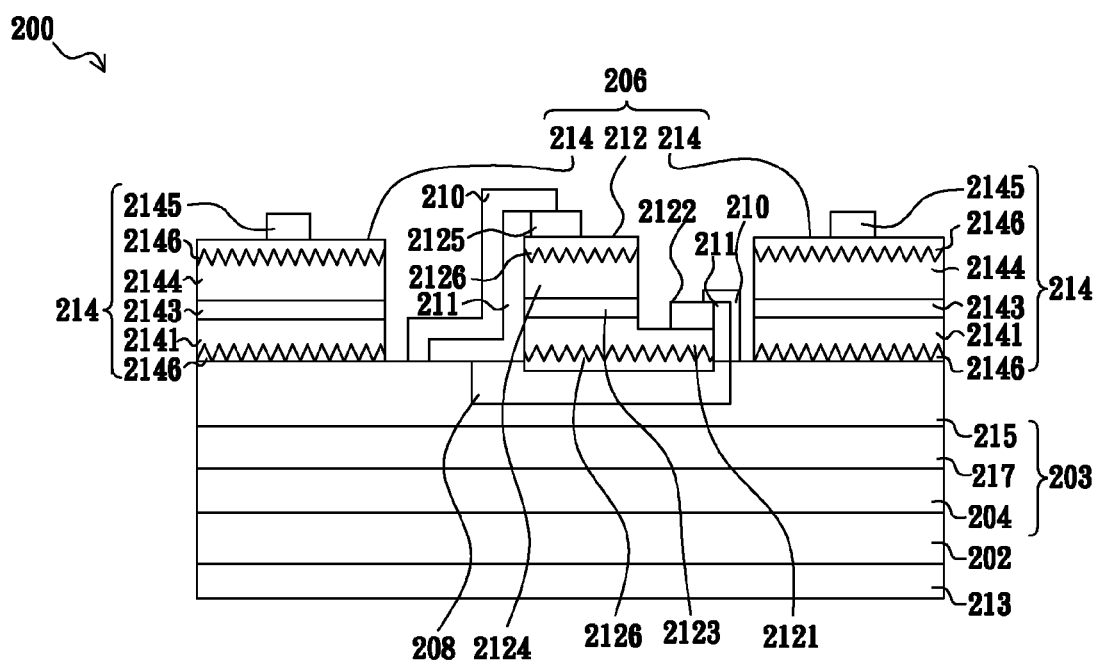
FIG. 2 shows a schematic diagram of a first embodiment of the present application.

As shown in FIG. 2, a light emitting element 200 includes a carrier 202, a conductive connecting structure 203 disposed on the carrier 202, an epitaxial stack structure 206 disposed on the conductive connecting structure 203, at least an insulation section 208 disposed between the epitaxial stack structure 206 and the conductive connecting structure 203, and at least a metal line 210 formed on the surface of the light emitting element 200, wherein the carrier 202 can be a conductive semiconductor substrate or a metal substrate, and the conductive connecting structure 203 can be a conductive stacked-structure.

The epitaxial stack structure 206 comprises: at least a first light-emitting stack 212 including two electrodes 2122 and 2125 having different polarity and located on the same side thereof; and at least a second light-emitting stack 214 including an electrode 2145 on the top surface thereof, and a bottom surface electrically connecting to the conductive connecting structure 203.

The first light-emitting stack 212 and the second light-emitting stack 214 can have the same structure which means the first light-emitting stack 212 and the second light-emitting stack 214 can be simultaneously formed on the same epitaxial substrate (not shown). As to the method for forming the first light-emitting stack 212 and the second light-emitting stack 214, the original epitaxial stack structure 206 can be firstly formed on the epitaxial substrate, and then the original epitaxial stack structure 206 on the epitaxial substrate is connected to the conductive connecting structure 203, and then the epitaxial substrate can be removed before defining the first light-emitting stack 212 and the second light-emitting stack 214 by exposing and development processes. The conductive connecting structure 203 can include a conductive connecting layer 204, a reflective layer 217 formed on the connecting layer 204, and a transparent conductive layer 215 formed on the reflective layer 217. The insulation section 208 can be embedded in the transparent conductive layer 215 corresponding to the first light-emitting stack 212. Besides, for enhancing the current spreading effect of the first light-emitting stack 212, a current spreading layer 2126 can be further formed on the bottom of the first light-emitting stack 212.

The transparent conductive layer 215 includes at least one material selected from the group consisting of ITO, SnO, CdSnO, TiSnO, ZnO, and ZnSnO. The reflective layer 217 includes at least one material selected from the group consisting of Sn, Al, Au, Pt, Zn, Ag, Ti, Pb, Ge, Cu, AuBe, AuGe, Ni, PbSn, and AuZn.

The first light-emitting stack 212 includes: a first semiconductor layer 2121 having an electrode 2122 thereon; an active layer 2123 formed on partial region of the first semiconductor layer 2121; and a second semiconductor layer 2124 formed on the active layer 2123 having an electrode 2125 thereon, wherein the insulation section 208 is embedded in the transparent conductive layer 215 corresponding to the first light-emitting stack 212 to insulate the first light-emitting stack 212 from the conductive connecting structure 203. From the bottom to top the second light-emitting stack 214 includes: a third semiconductor layer 2141 electrically connected to the conductive connecting structure 203 by the bottom surface thereof; an active layer 2143; and a forth semiconductor layer 2144 having an electrode thereon. The first semiconductor layer 2121 and the third semiconductor layer 2141 can be p type semiconductor layers, and the second semiconductor layer 2124 and the forth semiconductor layer 2144 can be n type semiconductor layers. The polarities of the semiconductor layers of the first light-emitting stack 212 or the second light-emitting stack 214 are changeable, in this way, the first semiconductor layer 2121 and the third semiconductor layer 2141 can be n type semiconductor layers, and the second semiconductor layer 2124 and the forth semiconductor layer 2144 can be p type semiconductor layers.

The first light-emitting stack 212 and the second light-emitting stack 214 can include at least one material selected from the group consisting of AlGaInP, AN, GaN, InGaN, AlInGaN and the structures of the first light-emitting stack 212 and the second light-emitting stack 214 include single heterostructure (SH), double heterostructure (DH), dluble-side double heterostructure (DDH) or multi-quantum well (MQW). The insulative section 208 can include at least one material selected from the group consisting of $SiO_2$ and $SiN_x$.

Besides, the first semiconductor layer 2121 and the second semiconductor layer 2124 of the first light-emitting stack 212 can further comprise a current spreading layer 2126 respectively. As to the manufacturing method of the current spreading 2126, a roughing surface can be firstly formed on the surface of the first semiconductor layer 2121 and/or the second semiconductor layer 2124, and then a conductive material same as the transparent conductive layer 215 can be formed on the roughing surface to form the current spreading layer 2126. The second light-emitting stack 214 can have a current spreading layer 2146 like the current spreading layer 2126, wherein the current spreading layer 2146 formed on the bottom of the third semiconductor layer 2141 having a roughing surface. The current can be spread more uniformly in the first light-emitting stack 212 and the second light-emitting stack 214 by having the current spreading layer 2126 and the current spreading layer 2146, respectively. The thickness of the current spreading layer 2126 located on the bottom of the first light-emitting stack 212 can be thicker than that of the current spreading layer 2146 to enhance the current-spreading effect of the first light-emitting stack 212. The bottom surfaces of the third semiconductor layer 2141 of the second light-emitting stack 214 can be directly connected to the transparent conductive layer 215, wherein a plurality of flat surfaces (not shown) are separately formed on the roughing current spreading layer 2146 to have good ohmic contact with the transparent conductive layer 215.

The metal lines 210 formed on the surface of the light emitting element 200 can connect the electrode 2125 or 2122 of the first light-emitting stack 212 to the transparent conductive layer 215 and further connect to the second light-emitting stack 214. The locations of the metal lines 210 are not merely restricted to the specific series/parallel circuit in accordance with the figure. The metal lines 210 can be either used to contact between two first light-emitting stacks 212 or second light-emitting stacks 214 according to the practical demand of the circuit design. The metal lines 210 can be formed by lithography process and is separated from the epitaxial stack structure 206 by a dielectric material 211 disposed therebetween. Accordingly, by way of the conductive connecting structure 203 electrically connected to the bottom surface of third semiconductor layer 2141 of the second light-emitting stack 214, and that the metal lines 210 formed on the surface of the light emitting element 200, the first light-emitting stacks 212 and the second light-emitting stacks 214 of the light emitting element 200 can be connected to form a series connection, a parallel connection or a connection including series and parallel connection.

The carrier 202 can be a conductive semiconductor substrate having a metal layer on the bottom surface thereof, or the carrier 202 can be a metal substrate to have a back electrode structure. When the light emitting element 200 is packaged to form a packaged structure, it can connect to an external power supplier (not shown) via the back electrode structure, and further electrically connect to the second light-emitting stacks 214 via the carrier 202 and the conductive connecting structure 203. The external power supply can connected to the first light-emitting stacks 212 via the carrier 202, the conductive connecting structure 203 and the metal lines 210.

Figure 3A:
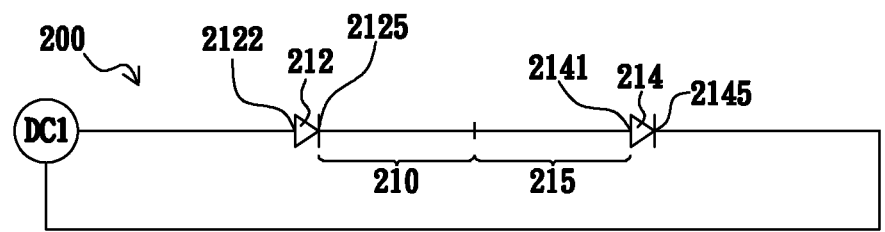
FIG. 3A to FIG. 3D respectively shows series/parallel circuit diagram implemented by light-emitting stacks of a first embodiment of the present application.

As shown in FIG. 3A, in the first embodiment of the present application, the light emitting element 200 can have a first light-emitting stack 212 and a second light-emitting stack 214. The two light-emitting stacks and a DC power supply DC1 are connected in series. As shown in FIG. 3A, the positive pole of the DC power supply DC1 is connected to the electrode 2122 of the first light-emitting stacks 212 to allow the current flowing into the first light-emitting stack 212 via the electrode 2122, and then exiting the first light-emitting stacks 212 via the electrode 2125. The electrode 2125 of the first light-emitting stacks 212 can be connected with the second light-emitting stack 214 via a metal line 210, wherein one end of the metal line 210 connects to the electrode 2125, and the other end thereof connects to the transparent conductive layer 215 to allow the current flowing into the second light-emitting stack 214 via the third semiconductor layer 2141 and exiting from the electrode 2145; the negative pole of the DC power supply DC1 connects to the electrode 2145 of the second light-emitting stack 214 so as to supply power to the series connection of the first light-emitting stack 212 and the second light-emitting stack 214 for light-emitting. Actually, the second light-emitting stack 214 can connect to a plurality of the first light-emitting stack 212 in series wherein the plurality of the first light-emitting stack 212 can be connected in series via the metal lines 210, and the first light-emitting stack 212 in the end of the whole circuit is connected to the DC power supply DC1.

Figure 3B:
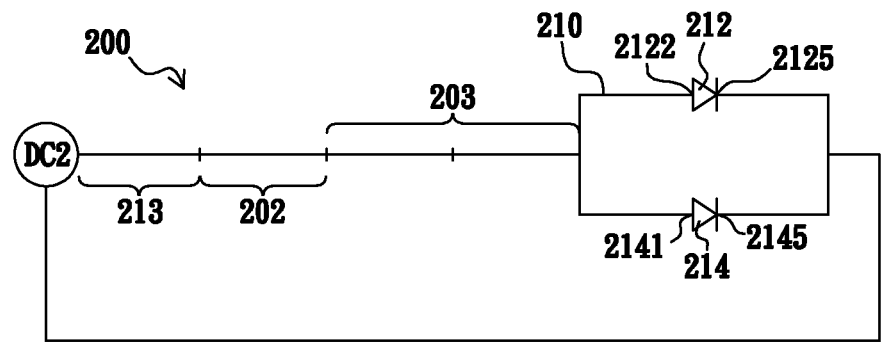

Please refer to FIG. 3B, in the first embodiment of the present application, the light emitting element 200 can have a first light-emitting stack 212 and a second light-emitting stack 214. The two light-emitting stacks and a DC power supply DC2 are connected to form a parallel connection circuit. The electrode 2122 of the first light-emitting stack 212 is connected to the conductive connecting structure 203 via the metal line 210, the positive pole of the DC power supply DC2 is connected to the metal layer 213. After passing the carrier 202 and the conductive connecting structure 203, the current are split to flow into the first light-emitting stack 212 and the second light-emitting stack 214 via the electrodes 2122 and 2141, respectively. The negative pole of the DC power supply DC2 is connected to both of the electrode 2125 of the first light-emitting stack 212 and the electrode 2145 of the second light-emitting stack 214, so that the current is collected to flow back to the DC power supply DC2. Similarly, the second light-emitting stack 214 can connect to a plurality of the first light-emitting stacks 212 in series to form a serially connection circuit, another series connection circuit can be formed by serially connecting a plurality of the first light-emitting stacks 212, and a parallel connection circuit can be formed by connecting the two series circuits to the DC power supply DC2.

Figure 3C:
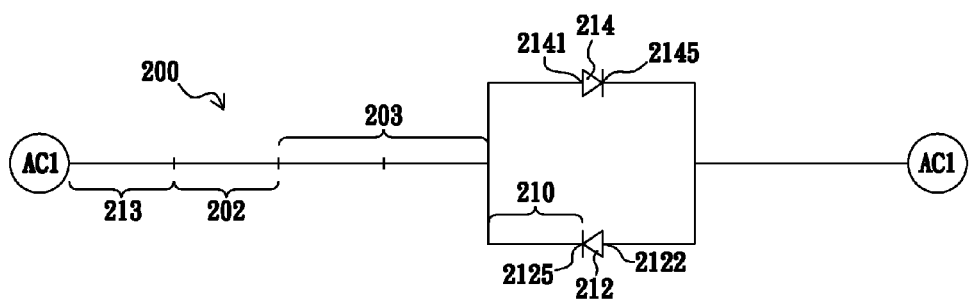

Please refer to FIG. 3C, in the first embodiment of the present application, the light emitting element 200 can have a first light-emitting stack 212 and a second light-emitting stack 214. The two light-emitting stacks and an external AC power supply AC1 are connected to form an anti-parallel connection circuit. The electrode 2125 of the first light-emitting stack 212 is connected to the third semiconductor layer 2141 via the metal line 210 and the conductive connecting structure 203. One end of the AC power supply AC1 is linked to the metal layer 213 to connect with the third semiconductor layer 2141 of the second light-emitting stack 214 and the electrode 2125 of the first light-emitting stack 212 via carrier 202 and the conductive connecting structure 203, and the other pole of the AC power supply AC1 directly connects to the electrode 2122 of the first light-emitting stack 212 and the electrode 2145 of the second light-emitting stack 214. Similarly, the second light-emitting stack 214 can connect to a plurality of the first light-emitting stacks 212 in series to form a serial connection circuit, another serial connection circuit can be formed by serially connecting a plurality of the first light-emitting stacks 212, and an anti-parallel connection circuit can be formed by connecting the two serial connection circuits to the AC power supply AC1.

Figure 3D:
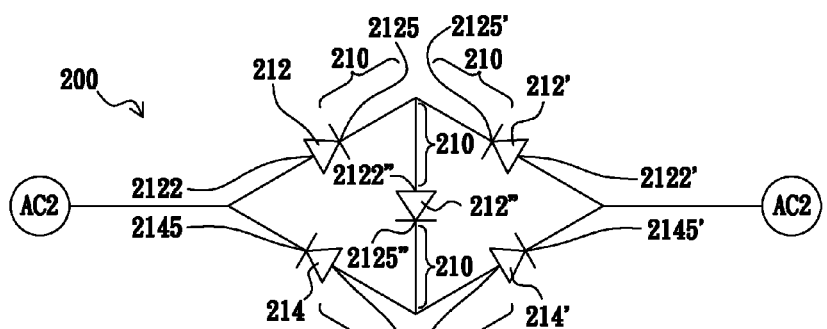

As shown in FIG. 3D, in the first embodiment of the present application, the light emitting element 200 can have a plurality of first light-emitting stacks 212, 212' and 212" and a plurality of second light-emitting stacks 214 and 214', wherein the plurality of the light-emitting stacks and an external AC power supply AC2 form a Wheatstone-bridge circuit.

The Wheatstone-bridge circuit shown in FIG. 3D includes the plurality of first light-emitting stacks 212, 212' and 212" and the plurality of second light-emitting stacks 214 and 214', wherein the electrodes 2125 and 2125' of the first light-emitting stack 212 and 212' located on a peripheral circuit jointly connect to the electrode 2122" of the first light-emitting stack 212" located on the vertical circuit via the metal lines 210, and the first light-emitting stacks 212" connects the electrode 2125" thereof to the conductive connecting structure 203 via the metal line 210 so as to electrically connect to the third semiconductor layer 2141 of the second light-emitting stacks 214 and 214' located on a peripheral circuit.

A pole of the AC power supply AC2 can connect to the electrode 2122 of the first light-emitting stack 212 and the electrode 2145 of the second light-emitting stack 214, and the other pole of the AC power supply AC2 can connect to the electrode 2122' of the first light-emitting stack 212 and the electrode 2145' of the second light-emitting stack 214'. Accordingly, a first circuit towards one direction comprises the first light-emitting stack 212, the first light-emitting stack 212" and the second light-emitting stack 214'. A second circuit towards another direction comprises the first light-emitting stacks 212', the first light-emitting stack 212" and the second light-emitting stacks 214. The first light-emitting stack 212 and the second light-emitting stack 214' of the first circuit are not limited to a single stack, but can form a first rectifier circuit and a second rectifier circuit by serially connecting a plurality of the first light-emitting stacks 212, and serially connecting the second light-emitting stacks 214' to a plurality of the first light-emitting stacks 212 respectively. The first light-emitting stack 212' and the second light-emitting stack 214 of the second circuit are not limited to a single stack, but can form a third rectifier circuit and a fourth rectifier circuit by serially connecting a plurality of the first light-emitting stacks 212', and serially connecting the second light-emitting stacks 214 to a plurality of the first light-emitting stacks 212' respectively.

Similarly, the amount of the first light-emitting stack 212" located on the vertical circuit and shared by the first circuit and the second circuit is not limited to one, but can be multiple for forming a main lighting circuit by serially connecting the first light-emitting stacks 212" to enhance the entire brightness of the light emitting element 200.

The serial/parallel connection circuits disclosed in the FIG. 3A to FIG. 3D are several common circuits that can be achieved by the special features of the light emitting element 200 of the embodiments of the present application. It does not restrict the structures of the light emitting element 200 in the present application. A person has ordinary skill in the art should have the ability to achieve the mentioned circuits by other serial/parallel connection circuits that are different from those disclosed in the embodiments of the present application.

Second Embodiment

Figure 4:
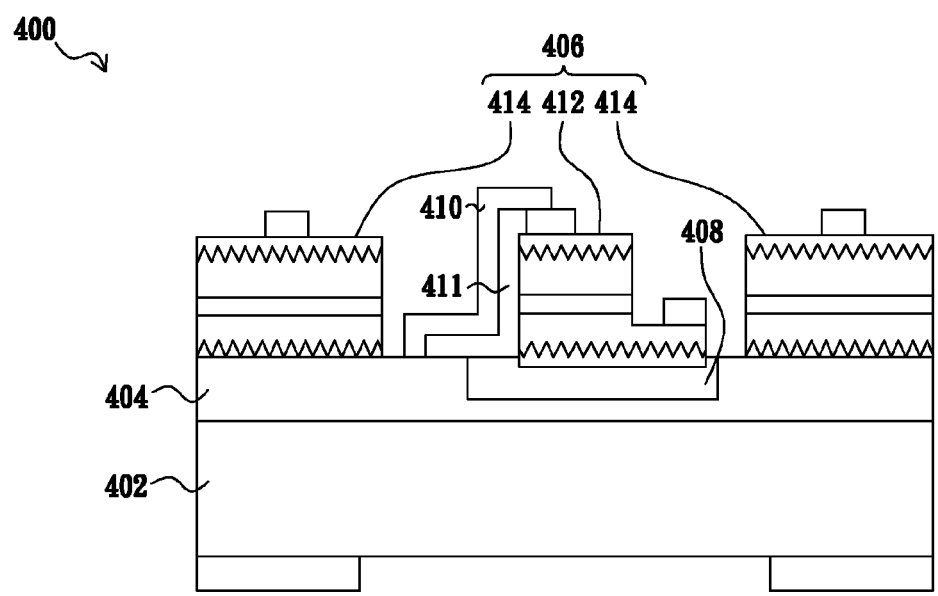
FIG. 4 shows a schematic diagram of a second embodiment of the present application.

As shown in FIG. 4, the light emitting element 400 comprises a carrier 402, a conductive connecting structure 404 disposed on the carrier 402, an epitaxial stack structure 406 disposed on the conductive connecting structure 404, an insulation section 408 disposed between the epitaxial stack structure 406 and the conductive connecting structure 404, and metal lines 410 formed on the surface of the light emitting element 400. A dielectric material 411 is formed between the surface of the epitaxial stack structure 406 and the metal lines 410.

The epitaxial stack structure 406 can include one or multiple first light-emitting stacks 412 and one or multiple second light-emitting stacks 414 electrically connected to the conductive connecting structure 404. The first light-emitting stacks 412 and the second light-emitting stacks 414 can be the same as that described in the first embodiment.

The present embodiment is similar to the first embodiment, but the conductive connecting structure 404 is a transparent connecting layer, and the carrier 402 is a transparent conductive substrate so as to increase the light output area.

Third Embodiment

Figure 5:
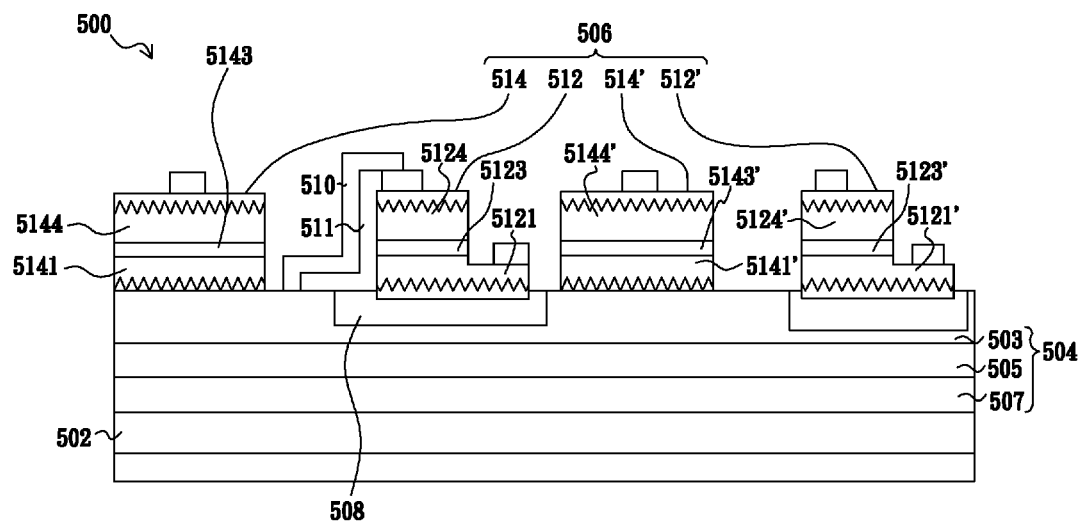
FIG. 5 shows a schematic diagram of a third embodiment of the present application.

As shown in FIG. 5, the light emitting element 500 comprises a carrier 502, a conductive connecting structure 504 disposed on the carrier 502, an epitaxial stack structure 506 disposed on the conductive connecting structure 504, an insulation section 508 disposed between the epitaxial stack structure 506 and the conductive connecting structure 504, and at least a metal line 510 formed on the surface of the light emitting element 500. The conductive connecting structure 504 can include a connecting layer 507, a reflective layer 505 formed on the connecting layer 507, and a transparent conductive layer 503 formed on the reflective layer 505. A dielectric material 511 is disposed between the metal line 510 and the surface of the epitaxial stack structure 506.

The epitaxial stack layer 506 can include first light-emitting stacks 512 and 512', and second light-emitting stacks 514 and 514' electrically connected to the conductive connecting structure 504.

The present embodiment can be achieved by modifying the first or second embodiments, and the main difference therebetween is the light-emitting stacks comprising the first light-emitting stacks 512 (512') and the second light-emitting stacks 514 (514') can have different epitaxial structures. In FIG. 5, the first light-emitting stacks 512 and 512' can be grown on different epitaxial substrates, so a first semiconductor layer 5121 and a second semiconductor layer 5124 on two sides of an active layer 5123 of the first semiconductor stack layer 512 is p type and n type, respectively, and a first semiconductor layer 5121' and a second semiconductor layer 5124' on two sides of an active layer 5123' of the first semiconductor stack layer 512' is n type and p type, respectively; and/or the second light-emitting stacks 514 and 514' can be grown on different epitaxial substrates, so a third semiconductor layer 5141 and a forth semiconductor layer 5144 on two sides of an active layer 5143 of the second semiconductor stack layer 514 is p type and n type, respectively, and a third semiconductor layer 5141' and a forth semiconductor layer 5144' on two sides of an active layer 5123' of the second semiconductor stack layer 514' is n type and p type, respectively; and/or the first semiconductor stack layer 512 and the second semiconductor stack layer 514 are grown on different epitaxial substrates, for example, the first semiconductor layer 5121 and the third semiconductor layer 5141 have different polarities, while the first semiconductor layer 5121 and 5121' have the same polarity.

Forth Embodiment

Figure 6:
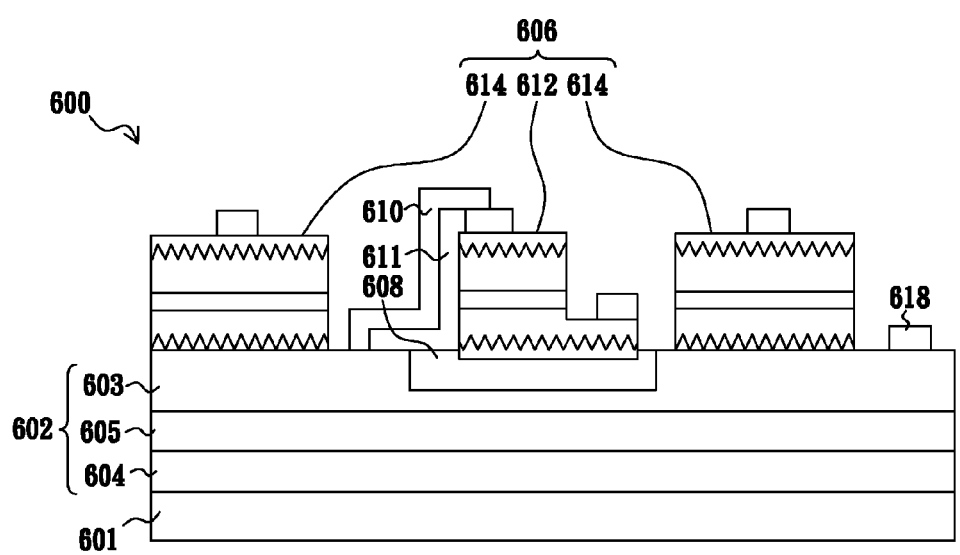
FIG. 6 shows a schematic diagram of a forth embodiment of the present application.

As shown in FIG. 6, the light emitting element 600 comprises a carrier 601 which is an insulative substrate, a conductive connecting structure 602 formed on the carrier 601, an epitaxial stack structure 606 formed on the conductive connecting structure 602, at least an insulation section 608 disposed between the epitaxial stack structure 606 and the conductive connecting structure 602, and at least a metal line 610 formed on the surface of the light emitting element 600, wherein a dielectric material 611 is disposed between the metal line 610 and the surface of the epitaxial stack structure 606. The conductive connecting structure 602 can include a connecting layer 604 formed on the carrier 601, a reflective layer 605 formed on the connecting layer 604, and a transparent conductive layer 603 formed on the reflective layer 605.

The first light-emitting stack layer 612 and second light-emitting stack layer 614 of the epitaxial stack structure 606 can be the same as the structure of the aforesaid embodiments.

Comparing with the previous embodiment, the carrier 601 in the present embodiment is an insulative substrate, and it is sufficient to have only the transparent conductive layer 603 as the conductive layer within the conductive connecting structure 602. A bonding pad 618 can be disposed on the surface of the transparent conductive layer 603 so as to connect an external power supply (not shown) by wire-bonding. The carrier 601 can include silicone, glass, quartz, ceramic, or Print Circuit Board (PCB). The transparent conductive layer 603 can include at least one material selected from the group consisting of ITO, SnO, CdSnO, TiSnO, ZnO and ZnSnO. The reflective layer 605 can include at least one material selected from the group consisting of Sn, Al, Au, Pt, Zn, Ag, Ti, Pb, Ge, Cu, AuBe, AuGe, Ni, PbSn and AuZn.

What is claimed is:

1. A light emitting element comprising:
a carrier;
a conductive connecting structure disposed on the carrier; and
an epitaxial stack structure disposed on the conductive connecting structure and comprising a plurality of electrically connected epitaxial light-emitting stacks, which substantially have the same width;
wherein at least one of the epitaxial stack structures has a side wall aligning with an outmost boundary of the carrier.

2. The light emitting element according to claim 1, wherein the conductive connecting structure comprises a transparent conductive connecting layer.

3. The light emitting element according to claim 1, wherein the conductive connecting structure comprises a conductive connecting layer formed on the carrier, a reflective layer formed on the conductive connecting layer, and a transparent conductive layer formed between the reflective layer and the epitaxial stack structure.

4. The light emitting element according to claim 1, wherein the electrically connected epitaxial light-emitting stacks are electrically connected via at least a metal layer.

5. The light emitting element according to claim 4, wherein the electrically connected epitaxial light-emitting stacks are formed in a serial connection.

6. The light emitting element according to claim 1, further comprising a transparent conductive layer connecting one of the electrically connected epitaxial light-emitting stacks to another.

7. The light emitting element according to claim 6, wherein the electrically connected epitaxial light-emitting stacks are formed in a serial connection.

8. The light emitting element according to claim 6, wherein the transparent conductive layer includes at least one material selected from the group consisting of ITO, SnO, CdSnO, TiSnO, ZnO and ZnSnO.

9. A light emitting element comprising:
a carrier;
a conductive connecting structure disposed on the carrier; and
an epitaxial stack structure disposed on the conductive connecting structure and comprising a plurality of electrically connected epitaxial light-emitting stacks, which substantially have the same width;
wherein the conductive connecting structure comprises a conductive connecting layer formed on the carrier, a reflective layer formed on the conductive connecting layer, and a transparent conductive layer formed between the reflective layer and the epitaxial stack structure.

10. The light emitting element according to claim 9, wherein the electrically connected epitaxial light-emitting stacks are electrically connected via at least a metal layer.

11. The light emitting element according to claim 10, wherein the electrically connected epitaxial light-emitting stacks are formed in a serial connection.

12. The light emitting element according to claim 9, wherein the transparent conductive layer includes at least one material selected from the group consisting of ITO, SnO, CdSnO, TiSnO, ZnO and ZnSnO.

* * * * *